United States Patent [19]

Young

[11] Patent Number: 4,733,183

[45] Date of Patent: Mar. 22, 1988

[54] NUCLEAR MAGNETIC RESONANCE METHODS AND APPARATUS

[75] Inventor: Ian R. Young, Sunbury-on-Thames, United Kingdom

[73] Assignee: Picker International Limited, Middlesex, England

[21] Appl. No.: 673,189

[22] Filed: Nov. 19, 1984

[30] Foreign Application Priority Data

Nov. 25, 1983 [GB] United Kingdom ............... 8331500

[51] Int. Cl.⁴ .................................... G01R 33/20
[52] U.S. Cl. .................................. 324/309; 324/318
[58] Field of Search ............... 324/309, 307, 311, 313, 324/314, 310, 318, 306

[56] References Cited

U.S. PATENT DOCUMENTS

| 4,051,429 | 9/1977 | Imanari et al. ............... 324/311 |
| 4,115,730 | 9/1978 | Mansfield .................... 324/312 X |
| 4,297,637 | 10/1981 | Crooks et al. ............... 324/309 |
| 4,318,043 | 3/1982 | Crooks et al. ............... 324/309 |
| 4,443,761 | 4/1984 | Levitt ........................ 324/311 |
| 4,593,247 | 6/1986 | Glover ........................ 324/309 |
| 4,599,565 | 7/1986 | Hoenninger, III et al. ....... 324/309 |

FOREIGN PATENT DOCUMENTS

| 0091008 | 12/1983 | European Pat. Off. . |
| 0132975A2 | 2/1985 | European Pat. Off. . |
| 3345209 | 6/1984 | Fed. Rep. of Germany . |
| 2121188A | 5/1983 | United Kingdom . |
| 2126731A | 9/1983 | United Kingdom . |

Primary Examiner—Stewart J. Levy
Assistant Examiner—Kevin D. O'Shea
Attorney, Agent, or Firm—Watts, Hoffmann, Fisher & Heinke Co.

[57] ABSTRACT

A method and apparatus for NMR imaging a selected elongated region of a body wherein different portions of the elongated region respectively defined by the intersection of a number of discrete first slices perpendicular to the region with a second slice containing the whole region are imaged in turn. Each portion is imaged by exciting spins in one of the first slices (B1 (90), G1z, −G1z) and then rotating through 180° any spins in the second slice (B2 (90), B3 (90), −Gy, Gy) the resulting spin echo of spins in the region of intersection of the first and second slices being then suitably encoded (Gx, G2z) and detected. The method and apparatus find particular application for imaging and spine of a patient.

5 Claims, 3 Drawing Figures

NUCLEAR MAGNETIC RESONANCE METHODS AND APPARATUS

This invention relates to methods and apparatus for investigating the distribution of a quantity in a selected region of a body using nuclear magnetic resonance (NMR) techniques.

NMR techniques have been used for the qualitative analysis of materials for many years. More recently NMR techniques have been used to obtain an indication of the distribution in a selected region of a body of a chosen quantity e.g. the density of chosen nuclei, for example, hydrogen protons, or NMR spin relaxation time constants. Such distributions are similar to, although of different significance from, the distributions of X-ray attenuation provided by computerised tomography systems, and have thus found especial application in medical examination of patients.

Although various methods have been devised for examining a selected region of body, no very satisfactory method exists for examining a selected elongated region within a body, for example, the spine of a patient. Thus, examining a patient's spine by selecting for examination a single slice of the patient containing the spine is not generally satisfactory since only a low resolution image can be obtained due to the relatively large area being imaged. Equally, selecting for examination a number of parallel slices generally perpendicular to the length of the spine, for example, using a multislice imaging technique in which some slices are scanned during the recovery time for other slices is not satisfactory due to the large number of slices required to be examined and the fact that a large part of the whole body of the patient is imaged, and much unwanted data is obtained.

It is an object of the present invention to provide a more satisfactory method and apparatus for carrying out such examinations.

According to one aspect of the invention there is provided a method for investigating the distribution of a quantity in a selected elongated region of a body using NMR techniques comprising the steps of: (1) exciting nuclear magnetic spins preferentially in a first selected slice of the body extending generally perpendicular to the length of said region and containing a portion of the length of said region; (2) rotating through 180° the nuclear magnetic spins in a second selected slice of the body containing substantially the whole length of said region and intersecting said first slice; (3) encoding the spins occurring in the portion of said first slice intersected by said second slice and detecting and processing to retrieve data signals representative of said encoded spins; and (4) repeating steps (1), (2) and (3) a plurality of times, the selected first slice for each step (1) being for a different slice of the body and hence containing a different portion of the length of said region.

According to a second aspect of the invention there is provided an apparatus for investigating the distribution of a quantity in a selected elongated region of a body using NMR techniques comprising: means arranged to excite nuclear magnetic spins preferentially in any selected one of a plurality of substantially discrete first slices of the body extending generally perpendicular to the length of said region and containing a portion of the length of said region; means arranged to rotate through 180° the nuclear magnetic spins in a second selected slice of the body containing substantially the whole length of said region and intersecting said first slices; means arranged to encode the spins occurring in the portion of any said selected first slice intersected by said second slice; a plurality of detector means each positioned adjacent a different one of said first slices to produce signals representative of the spins therein; processing means arranged to retrieve data from signals produced by said detector means; and switching means operable to supply to said processing means the signals detected by any selected one of said detector means.

One method and apparatus in accordance with the invention will now be described, by way of example, with reference to the accompanying drawings in which.

Figure 1:
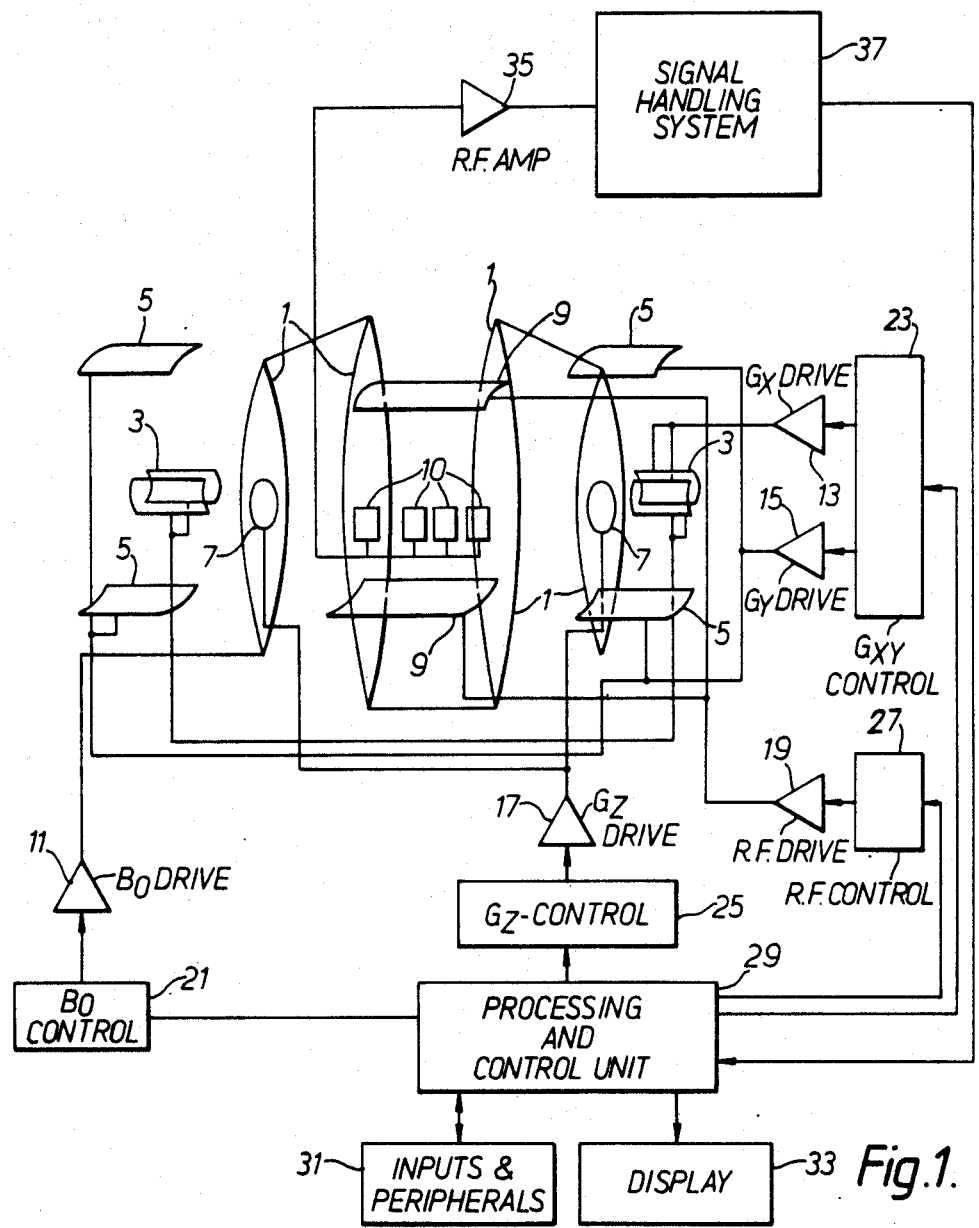
FIG. 1 illustrates the apparatus diagrammatically.

Referring to FIG. 1, the apparatus includes a first coil system whereby a magnetic field can be applied to a body to be examined in a given direction, hereafter designated the Z-direction, with a gradient in any one or more of the three orthogonal directions i.e. X, Y and Z directions.

Referring to FIG. 1, the first coil system comprises coils 1 which provide a steady uniform magnetic field Bo in the Z-direction; coils 3 which provide a magnetic field gradient Gx in the X-direction, coils 5 which provide a magnetic field gradient Gy in the Y-direction; and coils 7 which provide a magnetic field gradient Gz in the Z-direction.

In addition, the apparatus includes a second coil system including a pair of coils 9 whereby RF magnetic fields can be applied to the body under examination in a plane normal to the direction of the magnetic field produced by the first coil system. The second coil system further includes a number of coils 10 whereby RF magnetic fields resulting from nuclei in the body under examination which have been excited to nuclear magnetic resonance with a spin vector component other than in the Z-direction can be detected.

The coils 10 are spaced apart along the Z-direction and are arranged so that they may be positioned closely adajcent successive portions of an elongated region within a body being examined by means of the apparatus.

The various coils 1, 3, 5, 7 and 9 are driven by Bo, Gx, Gy, Gz and RF drive amplifiers 11, 13, 15 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 10 are applied via an amplifier arrangement 35 to a signal handling system 37.

Figure 2:
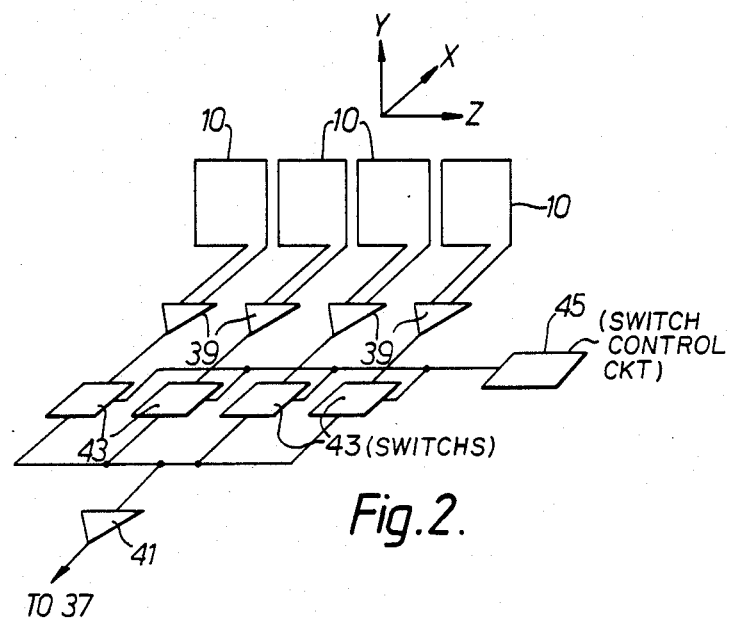
FIG. 2 is a diagram illustrating part of the apparatus of FIG. 1 in greater detail.

Referring now also to FIG. 2, the RF amplifier arrangement includes a separate pre-amplifier 39 for each coil the output from each amplifier 39 being fed to a main amplifier 41, and hence to the signal handling system 37, via a respective switch 43, the switches 43 being controlled by a switch control circuit 45 as hereinafter further described.

The signal handling system 37 is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

The apparatus also includes field measurement and error signal circuits (not shown) which receive signals from field probes (not shown) which are disposed at suitable positions in relation to the body being examined to monitor the applied fields.

A method of operating the apparatus of FIGS. 1 and 2 in accordance with the invention so as to obtain an image indicating the distribution of a quantity in the spine region of a patient will now be described with reference to FIG. 3.

The patient is first positioned in the apparatus with his torso in the region to which the field Bo is applied, his length parallel to the Z-direction, and his spinal region as closely adjacent the coils 10 as possible.

A steady magnetic field Bo is then applied in the Z-direction by means of coils 1, this field serving to define an equilibrium axis of magnetic alignment in the region of the patient being examined, i.e. along the Z-direction, and remaining constant throughout the examination procedure.

A magnetic field gradient G1z along the Z-direction is then applied (see FIG. 3B) by means of coils 7, together with a radio frequency (RF) magnetic field pulse denoted B1 (90°) for reasons explained hereafter (see FIG. 3A). The frequency of the RF field is chosen to be the Larmor frequency of chosen nuclei, typically hydrogen protons, in a first selected slice of the patient's body, normal to the Z-direction, containing that portion of the patient's spine adjacent a selected one of the coils 10. The slice is defined by a particular magnetic field along the Z-direction such that nuclei within the slice are preferentially excited. The integral of the RF pulse is such that the pulse is just sufficient to tip the spins of the excited nuclei into the X-Y plane, and is thus referred to as a 90° pulse, the spins then precessing in the X-Y plane around the Z-axis.

The field gradient G1z is then removed and replaced by a gradient in the opposite sense $-G1z$ (see FIG. 3B). This causes rephasing of the spins in the selected slice against dephasing resulting from the gradient across the slice during excitation, the $-Gz$ pulse being shaped so that the spins are just rephased at the time the $-G1z$ pulse is terminated. After a period T equal to a small fraction of the spin lattice relaxation time ($T_1$) of the excited nuclei further fields are applied to rotate through 180° the spins of the chosen nuclei in a second selected slice of the body parallel to the Z-direction and including the spine of the patient, the slice being either an X-Z (sagittal) or Y-Z (coronal) section slice as desired.

Figure 3:
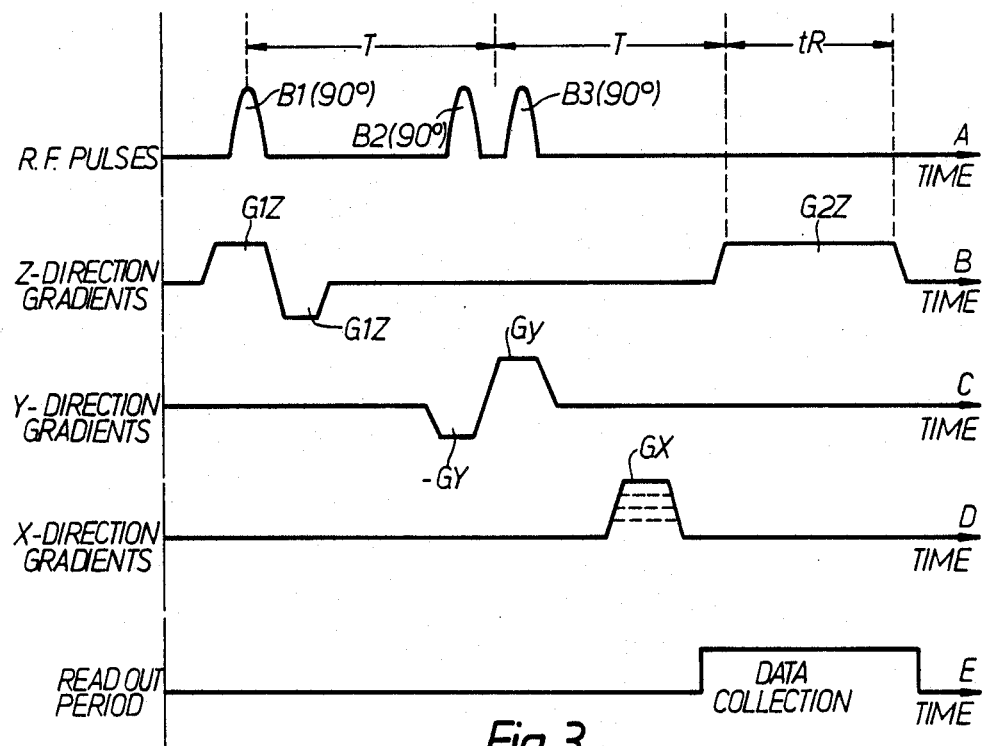
FIG. 3 illustrates the sequence of steps involved in the method.

As illustrated in FIG. 3 for an X-Z section slice, this is conveniently done by applying two 90° RF pulses B2(90°) and B3 (90°) in succession (see FIG. 3A), together with respective magnetic field gradients $-Gy$ and Gy along the Y-direction (see FIG. 3C) by means of coils 5. For a Y-Z slice the Gy and $-Gy$ gradients are replaced by Gx and $-Gx$ gradients (not shown).

The use of two 90° RF pulses to obtain the required 180° rotation of spins reduces the non-uniformity of rotation throughout the slice which is found to occur when a single 180° RF pulse is used.

The effect of the above described rotation of spins through 180° is to cause rephasing during a time T following the 180° rotation of any dephasing of the excited spins in that portion of the first selected slice which is intersected by the second selected slice which has occurred in the time T following the B1 (90°) RF pulse due, in particular, to any inhomogeneities in the nominally uniform field Bo. Thus at time 2T after the B1 (90°) RF pulse a spin-echo occurs of the free induction decay signal resulting from the B1 (90°) pulse.

It will be appreciated that the spin-echo signal arises solely from material in the part of the first slice intersected by the second slice, and thus arises only from an X-Z or Y-Z section of the first selected slice intersected by the second slice and containing a portion of the patient's spine.

The spin-echo signal is detected by that one of the coils 10 adjacent the excited portion of the patient's spine, the switch control circuit 45 being accordingly arranged to close the relevant one of the switches 43 at the appropriate time.

In order that the spin-echo signals arising from different parts of the section of the first selected slice can be separately identified, the spin-echo signals are detected during application of a Z-direction gradient G2z applied during the read out period $t_R$ (see FIG. 3B and 3E), and during the period T between the RF pulses B2 (90°) and B3 (90°) and the read out period an X-direction gradient Gx for an X-Z second slice (see FIG. 3D) or a Y-direction gradient for a Y-Z second slice (not shown) is applied by means of coils 3 or 5. This has the effect of frequency and/or phase encoding the signals from different parts of the section in known manner to permit their identification and processing, and so enable an image of the section to be presented on display 33 using the well-known two dimensional Fourier Transform (2DFT) image construction technique. It will be understood that for 2DFT image construction, the above sequence has to be repeated a number of times with a different value for the GX (or Gy) encoding pulse each time.

The above described procedure is then repeated to obtain in turn image data for the further portions of the patient's spine adjacent each of the other ones of the coils 10, and the data edited and assembled to provide an image of as much of the patient's spine as desired.

It will be understood that whilst in the method and apparatus described above by way of example a 2DFT image construction technique is used, the invention is equally applicable to methods and apparatus in which other methods of image construction are used.

For example, if a back projection image construction technique is used, then the Gx gradients of FIG. 3 are not required, and for each selected slice adjacent one of the coils 10, the sequence of FIG. 3 is repeated a number of times using each time, instead of the G2z gradient of FIG. 3, a gradient in a different direction in the plane of the second slice.

In the particular method and apparatus described above by way of example, the elongated region to be examined is disposed so that its length extends in the direction of the equilibrium axis of magnetic alignment i.e. the Z-direction, and consequently the detector means, i.e. coils 10, are spaced apart along the same direction. It is pointed out that this is not necessarily the case. Thus, in a method or an apparatus in accordance with the invention the elongated region to be examined may be disposed with its length in any desired direction. Similarly, in an apparatus according to the invention the detector means may be spaced apart along any direction, depending on which direction has been chosen for the length of the elongated region.

I claim:

1. A method of investigating the distribution of a quantity in a selected elongated region of a body using NMR techniques comprising the steps of: (1) exciting nuclear magnetic spins preferentially in a first selected slice of the body which is adjacent a particular one of a plurality of detector means which are at spaced positions along the direction of the length of said region and extends generally perpendicular to the length of said region and contains a portion of the length of said region; (2) rotating through 180° degrees the nuclear magnetic spins in second selected slice of the body containing substantially the whole length of said region and intersected by said first slice said second slice being generally perpendicular to said first slice; (3) spatially encoding in at least one direction parallel to said second slice the spins occurring in the portion of said second slice intersected by said first slice; (4) detecting signals representative of said encoded spins using only said particular one of said plurality of detector means; (5) processing said signals to retrieve data; and (6) repeating steps (1), (2), (3), (4) and (5) a plurality of times with a different spatial encoding of spins in each step (3) so that the data retrieved during steps (5) together indicate the distribution of said quantity in said portion of said second slice in planes parallel to said second slice; and (7) repeating steps (1) to (6) a plurality of times, utilizing different particular ones of said detector means, the selected first slice for each step (1) each time being for a different particular slice of the body adjacent a different one of said detector means and hence containing a different portion of the length of said region.

2. A method according to claim 1 wherein said rotation through 180° is effected by applying two 90° RF pulses in succession together with respective gradients on a magnetic field defining an equilibrium axis of magnetic alignment in the body being investigated, said gradients being respectively directed in opposite directions perpendicular to said second selected slice.

3. An apparatus for investigating the distribution of a quantity in a selection region of a body using NMR techniques comprising: means arranged to excite nuclear magnetic spins preferentially in any selected one of a plurality of substantially discrete first slices of the body extending generally perpendicular to the length of said region and containing a portion of the length of said region; means arranged to rotate through 180° the nuclear magnetic spins in a second selected slice of the body containing substantially the whole length of said region and intersecting said first slices said second slice being generally perpendicular to said first slices; means arranged to apply magnetic field gradients in different directions in the plane of said second selected slice to spatially encode in planes parallel to said second slice the spins occurring in any portion of said selected second slice intersected by a said first slice; a plurality of detector means each positioned adjacent a different one of said first slices to produce signals representative of the spins therein; processing means arranged to retrieve data from signals produced by said detector means; and switching means operable to supply to said processing means the signals detected by only a selected one of said detector means at any one time.

4. An apparatus according to claim 3 wherein said means arranged to rotate through 180° comprises means arranged to apply two 90° RF pulses in succession together with respective gradients on a magnetic field defining an equilibrium axis of magnetic alignment in the body being investigated, said gradients being respectively directed in opposite directions perpendicular to said second selected slice.

5. An apparatus according to claim 3 wherein each said detector means comprises a respective coil.

* * * * *